United States Patent
Kim et al.

(10) Patent No.: US 8,363,474 B2
(45) Date of Patent: Jan. 29, 2013

(54) VARIABLE RESISTANCE MEMORY DEVICE

(75) Inventors: Hojung Kim, Suwon-si (KR);
Sangbeom Kang, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 343 days.

(21) Appl. No.: 12/461,936

(22) Filed: Aug. 28, 2009

(65) Prior Publication Data
US 2010/0103724 A1    Apr. 29, 2010

(30) Foreign Application Priority Data
Oct. 23, 2008  (KR) .................. 10-2008-0104114

(51) Int. Cl.
*G11C 11/34*    (2006.01)
(52) U.S. Cl. .............. 365/185.18; 365/226; 365/185.25; 365/163
(58) Field of Classification Search ............. 365/185.18, 365/226, 185.25, 163
See application file for complete search history.

(56) References Cited

U.S. PATENT DOCUMENTS

| | | | |
|---|---|---|---|
| 5,243,575 A * | 9/1993 | Sambandan et al. ........ | 365/233.5 |
| 6,480,419 B2 * | 11/2002 | Lee .......................... | 365/185.18 |
| 6,975,554 B1 | 12/2005 | Lapidus et al. | |
| 2006/0056233 A1 * | 3/2006 | Parkinson et al. ............ | 365/163 |

FOREIGN PATENT DOCUMENTS

| KR | 10-2006-0134308 | 12/2006 |
|---|---|---|
| KR | 10-2008-0060936 | 7/2008 |

* cited by examiner

*Primary Examiner* — Jason Lappas
(74) *Attorney, Agent, or Firm* — Harness, Dickey & Pierce P.L.C.

(57) ABSTRACT

The variable resistance memory device may include a memory cell array including a plurality of memory blocks, a bit line selection circuit including a plurality of bit lines connected to the plurality of memory blocks, at least one readout Y-pass driver configured to control a connection of the bit line selection circuit when a readout operation is performed, and a write Y-pass driver configured to control a connection of the bit line selection circuit when a write operation is performed. The write Y-pass driver is configured to control at least two of the plurality of bit lines connections.

9 Claims, 7 Drawing Sheets

VARIABLE RESISTANCE MEMORY DEVICE

PRIORITY STATEMENT

This U.S. non-provisional patent application claims priority under 35 U.S.C. §119 of Korean Patent Application No. 10-2008-0104114, filed on Oct. 23, 2008, the entire contents of which are herein incorporated by reference in their entirety.

BACKGROUND

Example embodiments disclosed herein relate to variable resistance memory devices, for example, to variable resistance memory devices reducing an area of a Y-pass driver.

Semiconductor memory devices are memory device that can store data and readout the stored data when necessary. Semiconductor devices may be classified into random access memory (RAM) devices and read only memory (ROM) devices. ROM devices are nonvolatile memory device that retain their stored data even when their power supplies are interrupted. ROM devices may include a programmable read only memory (PROM), an erasable programmable read only memory (EPROM), an electrically erasable programmable read only memory (EPROM) and a flash memory. A flash memory may be divided into a NOR flash memory and/or a NAND flash memory. RAM devices are volatile memory devices that lose their stored data when their power supplies are interrupted. RAM devices may include a dynamic random access memory (DRAM) and/or a static random access memory (SRAM).

Semiconductor memory device substituting a nonvolatile material for a capacitor of DRAM have been introduced. For example, there are a ferroelectric RAM (FRAM) using a ferroelectric capacitor, a magnetic RAM (MRAM) using a tunneling magneto-resistive layer and a phase change memory device using chalcogenide alloys. The phase change memory device is a nonvolatile memory device using a phase change (e.g., a resistance change) according to a temperature change. A manufacturing process of a phase change memory device may be relatively simple and therefore a large quantity of memory may be produced at a relatively lower cost.

A phase change memory device may include a write driver circuit to supply a program current to a phase change material (GST) when a program operation is performed. The write driver circuit may supply a program current (e.g., a set current or a reset current) to a memory cell using a supply voltage higher than 2.5V externally provided. Here, the set current may be a current for making a phase change material (GST) of a memory cell a set state and the reset current may be a current for making a phase change material (GST) of a memory cell a reset state.

SUMMARY

According to example embodiments, a variable resistance memory device may include a memory cell array including a plurality of memory blocks, a bit line selection circuit including a plurality of bit lines connected to the plurality of memory blocks, at least one readout Y-pass driver configured to control a connection of the bit line selection circuit when a readout operation is performed, and a write Y-pass driver configured to control a connection of the bit line selection circuit when a write operation is performed. The write Y-pass driver is configured to control at least two of the plurality of bit lines connections.

In example embodiments, the variable resistance memory device may be included in a memory system that further includes a central processing unit, a variable resistance memory device operated by a control of the central processing unit, and an interface device connecting the central processing unit to the variable resistance memory device.

According to example embodiments, a variable resistance memory device may include a memory cell array including a plurality of memory blocks, a plurality of bit lines connected to the plurality of memory blocks, and a write Y-pass driver configured to control a connection of the plurality of bit lines when a write operation is performed. The write Y-pass driver is configured to control at least two of the plurality of bit lines connections.

BRIEF DESCRIPTION

The accompanying figures are included to provide a further understanding of example embodiments, and are incorporated in and constitute a part of this specification. The drawings illustrate example embodiments and, together with the description, serve to explain principles of the example embodiments. In the figures.

DETAILED DESCRIPTION

Example embodiments will be described below in more detail with reference to the accompanying drawings. Example embodiments may, however, be embodied in different forms and should not be constructed as limited to the embodiments set forth herein. Rather, example embodiments are provided so that this disclosure will be thorough and complete, and will fully convey the scope of example embodiments to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 1:
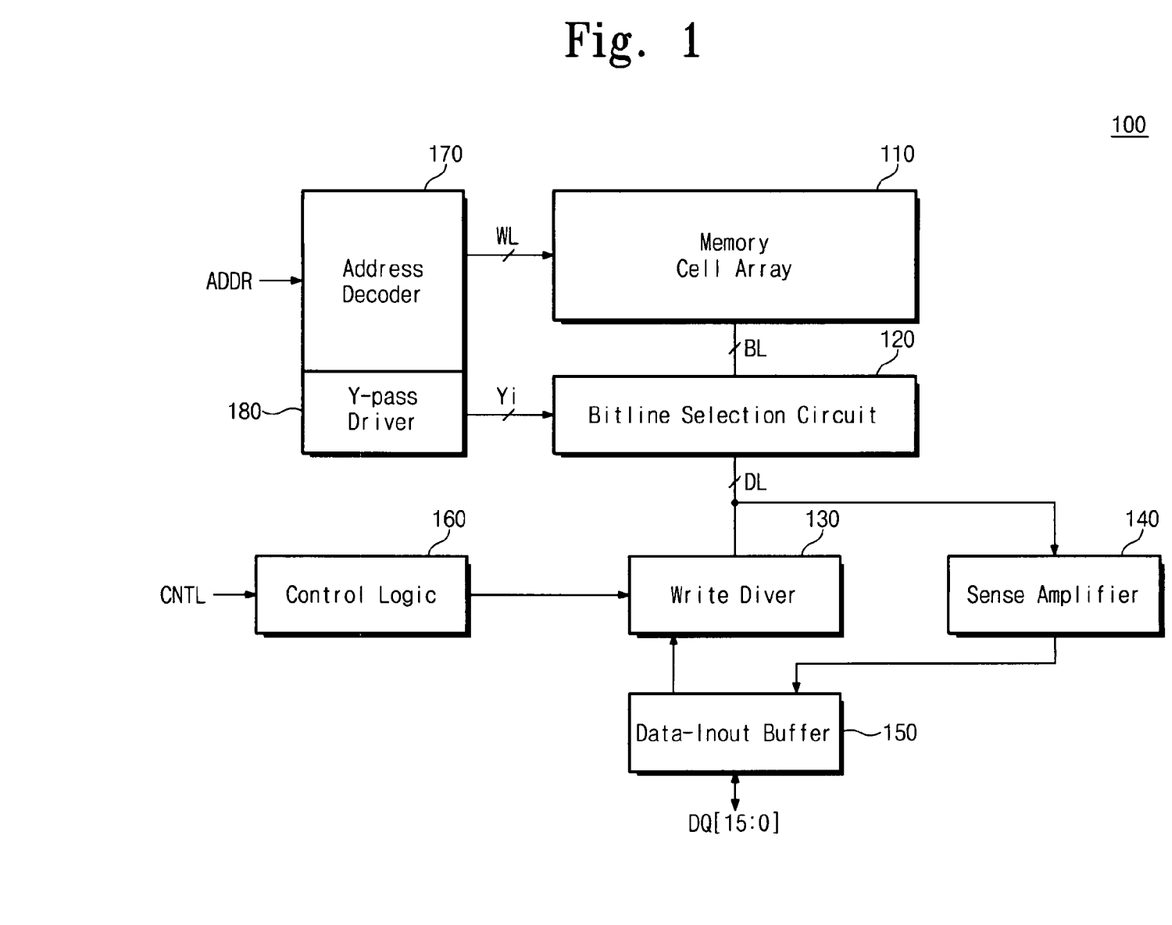
FIG. 1 is a block diagram of a general variable resistance memory device.

FIG. 1 is a block diagram of a general variable resistance memory device. Referring to FIG. 1, a variable resistance memory device 100 may include a memory cell array 110, a bit line selection circuit 120, a write driver 130, a sense amplifier 140, a data input/output buffer 150, a control logic 160, an address decoder 170 and a Y-pass driver 180.

Each of memory cells in the memory cell array 110 may include a variable resistance memory element. Generally, a variable resistance memory element may include a phase change memory cell.

An address decoder 170 is connected to the memory cell array 110 through a word line (WL). The address decoder 170 decodes an address ADDR externally inputted and provides a bias voltage to a selected word line. A Y-pass driver 180 generates a selection signal (Yi) to select a bit line (BL). The selection signal (Yi) is provided to the bit line selection circuit 120. The address decoder 170 receives the address ADDR for selecting at least one of the memory cells of the memory cell array 110 when a readout operation is performed.

Figure 2:
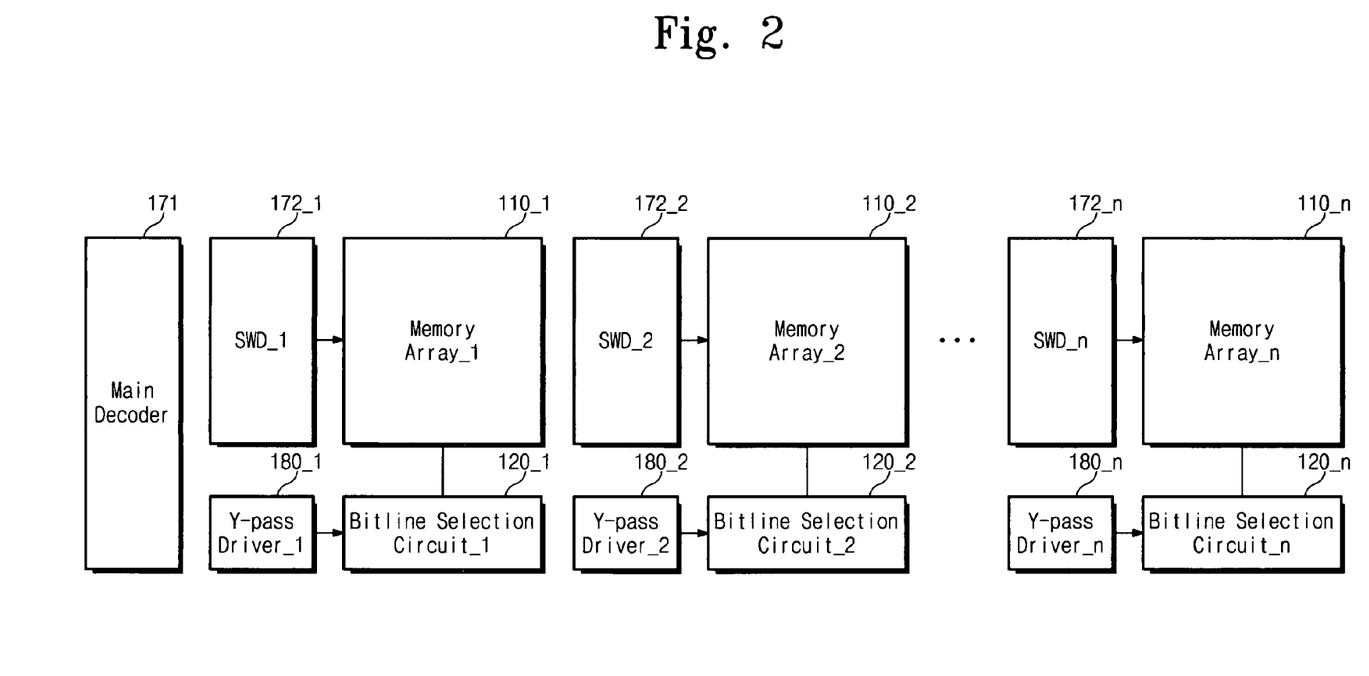
FIG. 2 is a block diagram of a connection of a Y-pass driver and a bit line selection circuit depicted in FIG. 1.
Figure 3:
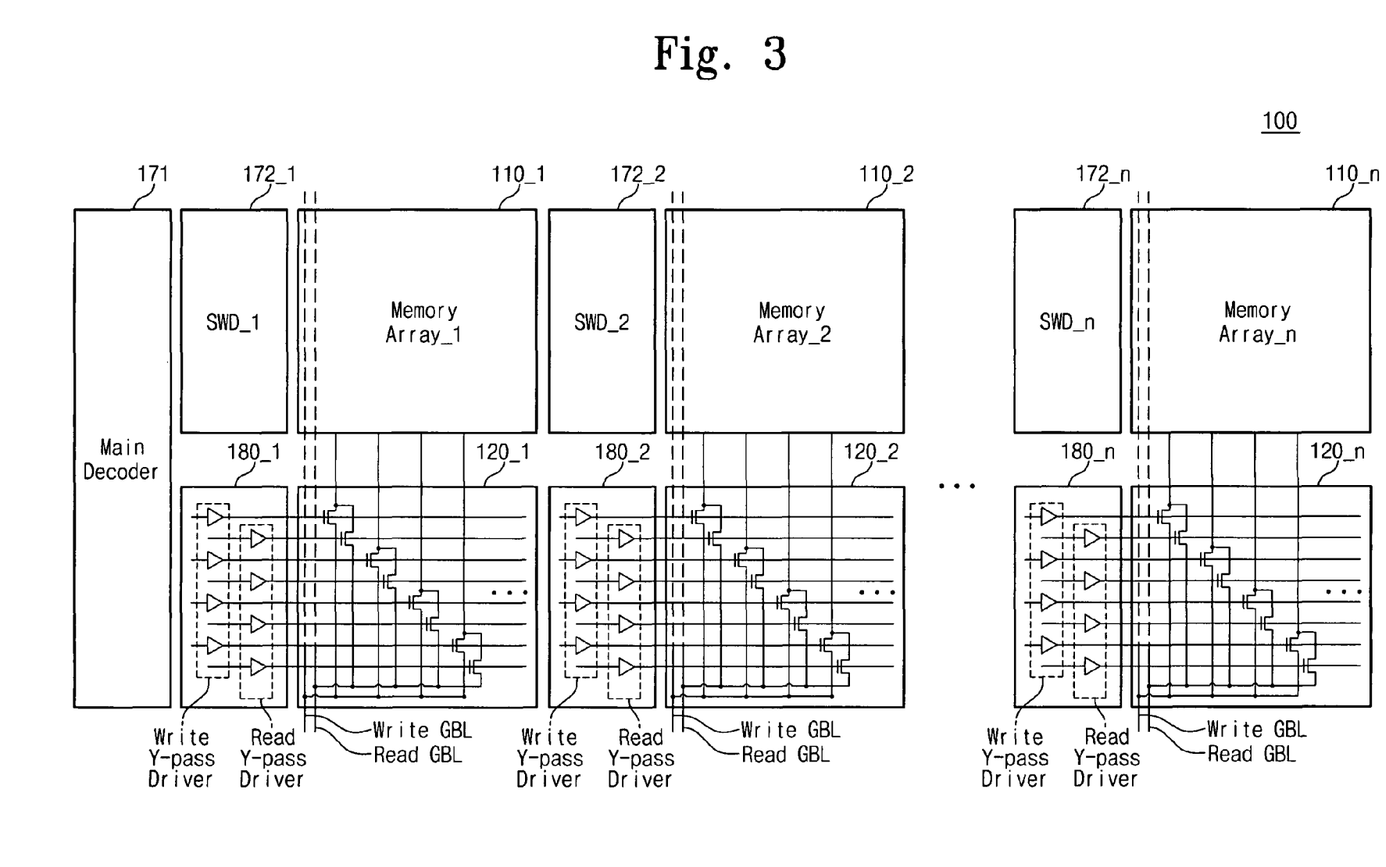
FIG. 3 is a circuit of a connection of a Y-pass driver and a bit line selection circuit depicted in FIG. 1.

The bit line selection circuit 120 is connected to the memory cell array 110 through a bit line (BL). The bit line selection circuit 120 selects a bit line (BL) of the memory cell array 110 in response to the selection signal (Yi) provided from the Y-pass driver 180 when a readout operation and/or a program operation are performed. The bit line selection circuit 120 includes a plurality of NMOS transistors, as shown in FIGS. 2 and 3. Here, an NMOS transistor electrically connects a bit line (BL) to a data line (DL) in response to a selection signal (Yi).

The write driver 130 receives data (DQ [15:0]) from the data input/output buffer 150. Also, the write driver 130 receives a program pulse from the control logic 160 and provides a program current to a data line (DL). Here, the program pulse is provided from a program loop circuit (not shown) in the control logic 160 and includes a set pulse and a reset pulse. The program current includes a set current and a reset current. The write driver 130 provides a set current in response to a set pulse when data '0' is inputted and provides a reset current in response to a reset pulse when data '1' is inputted.

The sense amplifier 140 reads out data stored in a memory cell to provide the data to the data input/output buffer 150 when a readout operation or a program verification operation is performed. The sense amplifier 140 readouts data stored in a memory cell to perform a program verification operation when a program verification operation is performed. The control logic 160 controls the write driver 130 so as to perform a readout operation or a program verification operation in response to a control signal (CNTL).

FIG. 2 is a block diagram of a connection of the Y-pass driver 180 and the bit line selection circuit 120 depicted in FIG. 1. FIG. 3 is a circuit of a connection of the Y-pass driver 180 and a bit line selection circuit 120 depicted in FIG. 1.

Referring to FIGS. 1 through 3, the memory cell array 110 includes first through nth memory arrays (110_1~110_n). The address decoder 170 includes a main decoder 171 and first through nth sub word line decoders (172_1~172_n). The Y-pass driver 180 includes first through nth Y-pass drivers (180_1~180_n). The bit line selection line 120 includes first through nth bit line selection circuits (120_1~120_n).

The main decoder 171 receives an ADDR signal and transmits the ADDR signal to the first through nth sub word line decoders (172_1~172_n). A first sub word line 172_1 provides a bias voltage to a word line (WL) of a first memory array 110_1. Bit lines controlled by a write Y-pass driver are connected to a write global bit line (write GBL) and bit lines controlled by a readout Y-pass driver are connected to a readout global bit line (readout GBL). A first Y-pass driver 180_1 includes a write Y-pass driver and a readout Y-pass driver. A readout Y-pass driver of the first Y-pass driver 180_1 controls a first bit line selection circuit 120_1 in a readout operation and a write Y-pass driver of the first Y-pass driver 180_1 controls the first bit line selection circuit 120_1 in a write operation.

A second sub word line decoder 172_2 provides a bias voltage to a word line of a second memory array 110_2. A second Y-pass driver 180_2 includes a write Y-pass driver and a readout Y-pass driver. A readout Y-pass driver of the second Y-pass driver 180_2 controls a second bit line selection circuit 120_2 in a readout operation and a write Y-pass driver of the second Y-pass driver 180_2 controls a second bit line selection circuit 120_2 in a write operation.

The variable resistance memory device 100 depicted in FIGS. 1 through 3 can perform a read while write operation. The variable resistance memory device 100 includes a Y-pass transistor for a readout and a separate Y-pass transistor for a write for a single bit line so as to perform the read while write operation. Thus, the variable resistance memory device 100 includes a Y-pass driver for a readout operation and a Y-pass driver for a write operation separately.

Generally, a write cycle time is longer than a readout cycle time in a variable resistance memory device. For example, a readout cycle time of a phase change memory device may be several tens of nanoseconds while a write cycle time of a phase change memory device may be several hundreds of nanoseconds to several microseconds.

A variable resistance memory device according to example embodiments may use a Y-pass driver for a write operation in common. According to a variable resistance memory device of example embodiments, an area of a Y-pass driver may be reduced. A variable resistance memory device according to example embodiments is described in FIGS. 4 through 6 in more detail.

Figure 4:
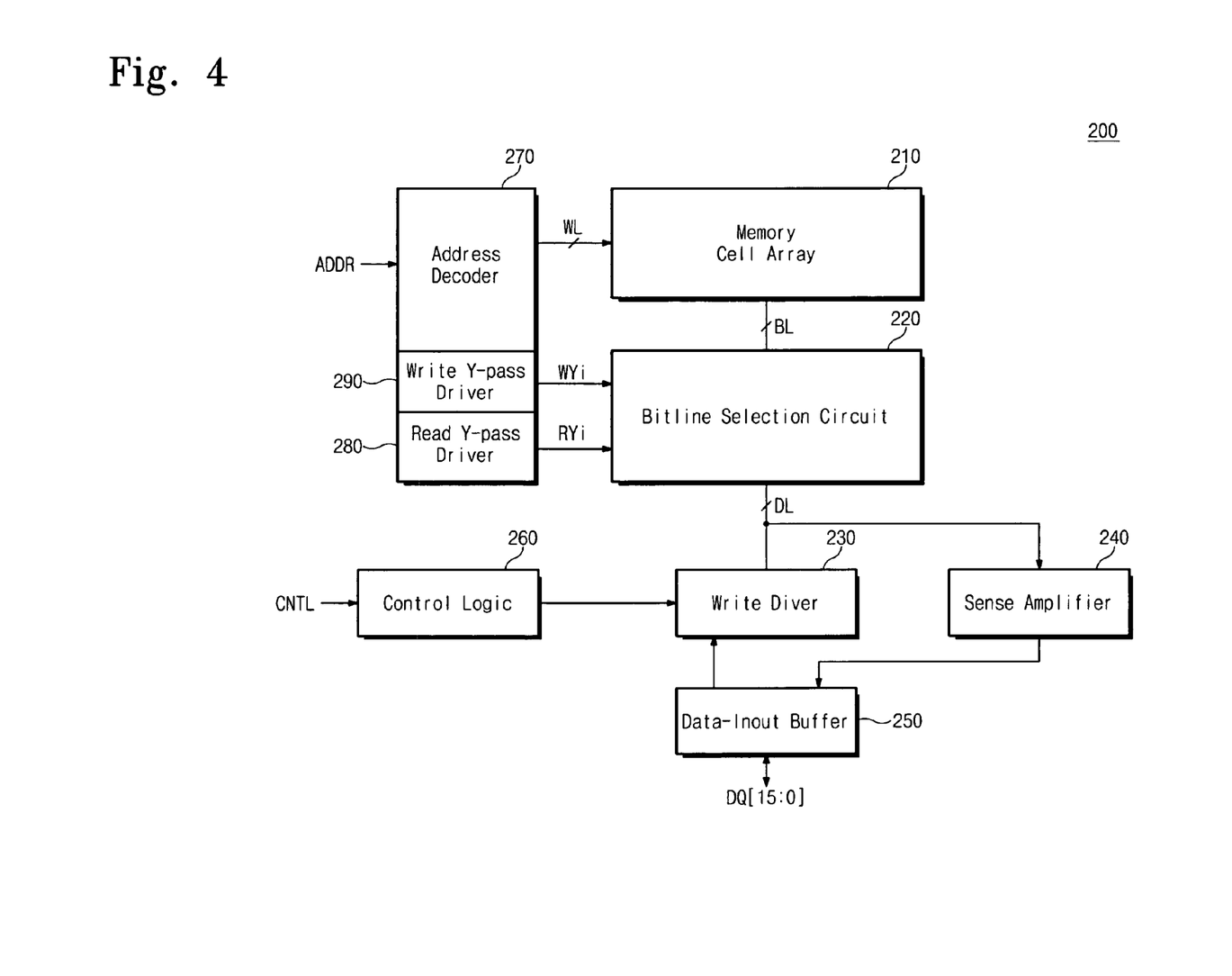
FIG. 4 is a block diagram of a variable resistance memory device according to example embodiments.

FIG. 4 is a block diagram of a variable resistance memory device according to example embodiments. The variable resistance memory device 200 is somewhat similar to the variable resistance memory device 100 depicted in FIG. 1 except for a write Y-pass driver 290. Thus, the description of common features will be omitted.

Referring to FIG. 4, a phase change memory device is exemplified in the variable resistance memory device 200 according to example embodiments. Each of memory cells in a memory cell array 210 includes a memory element and a selection element. The memory element includes a phase change material (GST) and the selection element may include an NMOS transistor or a diode. The phase change material (GST) is a variable resistance device having a resistance that is changed depending on a temperature of a material, such as Germanium (Ge), Antimony (Sb) or Tellurium (Te). The phase change material (GST) has one of two stable states (e.g., a crystal state and an amorphous state) according to a temperature. The phase change material (GST) changes to a crystal state or an amorphous state depending on a current provided through a bit line (BL). A phase change memory device programs data using the above characteristics of a phase change material (GST).

In FIG. 4, an address decoder 270 is connected to a memory cell array 210 through a word line (WL). The address decoder 270 decodes an ADDR signal externally inputted and provides a bias voltage to a selected word line.

Also, a readout Y-pass driver 280 generates a readout selection signal (RYi) for selecting a bit line (BL) when a readout operation is performed. The readout selection signal (RYi) is provided to a bit line selection circuit 220. A write Y-pass driver 290 generates a write selection signal (WYi) for selecting a bit line (BL) when a write operation is performed. The write selection signal (WYi) is provided to the bit line selection circuit 220. The readout Y-pass driver 280 and the write Y-pass driver 290 are described in FIGS. 5 and 6 in more detail.

Figure 5:
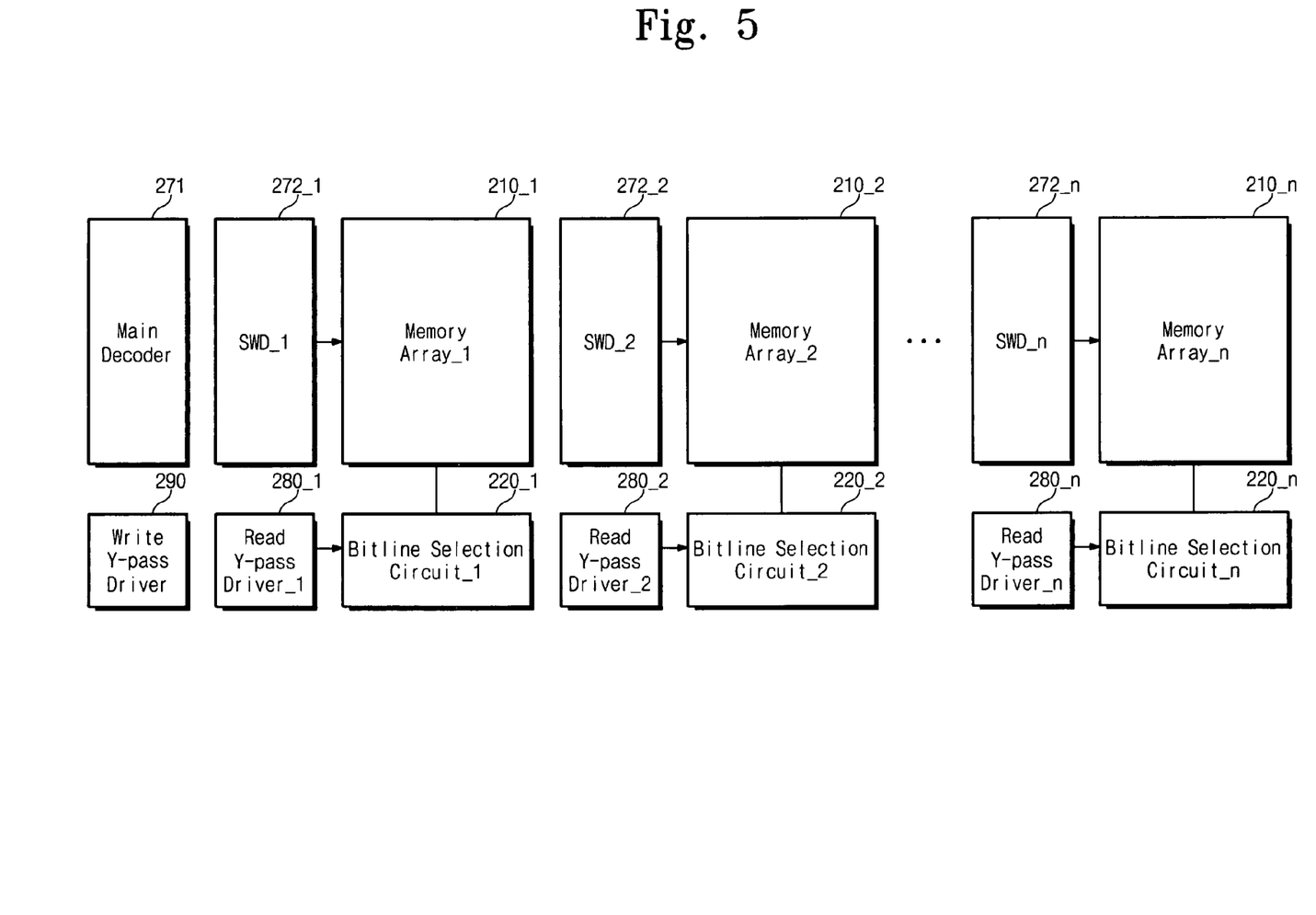
FIG. 5 is a block diagram of a connection of a Y-pass driver and a bit line selection circuit depicted in FIG. 4.
Figure 6:
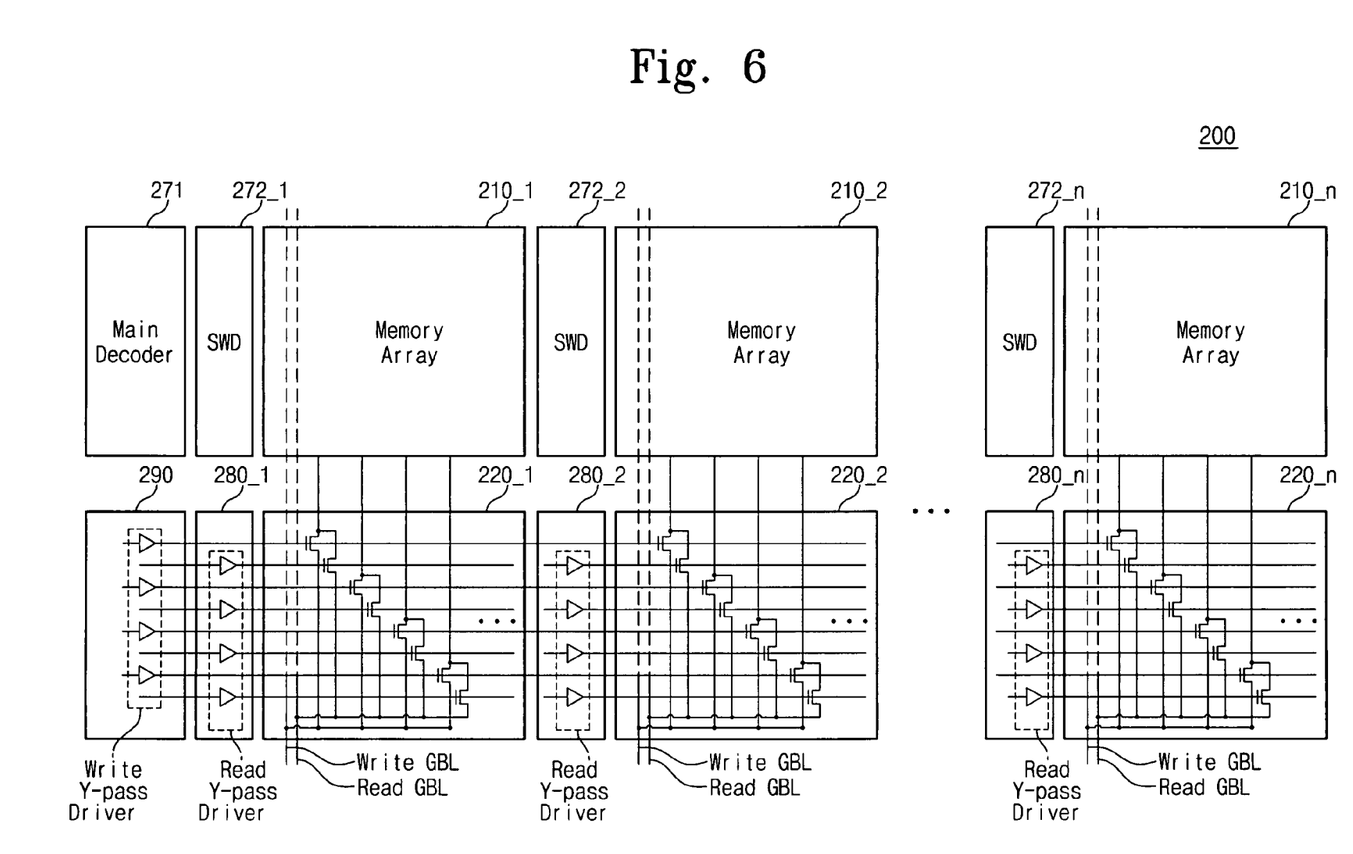
FIG. 6 is a circuit of a connection of a Y-pass driver and a bit line selection circuit depicted in FIG. 4.

FIG. 5 is a block diagram of a connection of a Y-pass driver and a bit line selection circuit depicted in FIG. 4. FIG. 6 is a circuit of a connection of a Y-pass driver and a bit line selection circuit depicted in FIG. 4.

Referring to FIGS. 4 through 6, the memory cell array 210 includes first through nth memory arrays (210_1~210_n). The address decoder 270 includes a main decoder 271 and first through nth sub word line decoders (272_1~272_n). The readout Y-pass driver 280 includes first through nth readout Y-pass drivers (280_1~280_n). The bit line selection circuit 220 includes first through nth bit line selection circuits (220_1~220_n). The readout Y-pass driver 280 exists at every memory array and the write Y-pass driver 290 exists in common.

The main decoder 271 receives an address signal (ADDR) and transmits the address signal (ADDR) to the first through nth sub word line decoders (272_1~272_n). The first sub word line decoder 272_1 provides a bias voltage to a word line (WL) of the first memory array 210_1. The first readout Y-pass driver 280_1 controls the first bit line selection line 220_1 when a readout operation is performed and the write Y-pass driver 290 controls the first bit line selection line 220_1 when a write operation is performed.

The second sub word decoder 272_2 provides a bias voltage to a word line of the second memory array 210_2. The second readout Y-pass driver 280_2 controls the second bit line selection line 220_2 when a readout operation is performed and the write Y-pass driver 290 controls the second bit line selection line 220_2 when a write operation is performed.

The nth sub word decoder 272_2 provides a bias voltage to a word line of the nth memory array 210_2. The nth readout Y-pass driver 280_n controls the nth bit line selection line 220_n when a readout operation is performed and the write Y-pass driver 290 controls the nth bit line selection line 220_n when a write operation is performed.

The variable resistance memory device 200 depicted in FIGS. 4 through 6 can perform a read while write operation. The variable resistance memory device 200 includes a Y-pass transistor for a readout and a separate Y-pass transistor for a write for a single bit line so as to perform the read while write operation.

Generally, a write cycle time is longer than a readout cycle time in a variable resistance memory device. For example, a readout cycle time of a phase change memory device may be several tens of nanoseconds while a write cycle time of a phase change memory device may be several hundreds of nanoseconds to several microseconds.

A variable resistance memory device according to example embodiments may use a write Y-pass driver in common as depicted in FIGS. 5 and 6. For example, a variable resistance memory device according to example embodiments may perform a read while write. Also, a variable resistance memory device according to example embodiments may be smaller in size or area by using a write Y-pass driver in common.

For example, a variable resistance memory device according to example embodiments may separately include a bit line selection pass transistor for a readout operation and a bit line selection pass transistor for a write operation. For example, when a plurality of memory arrays of a variable resistance memory device are disposed in an X axis direction, a pass transistor for a readout operation is disposed on every memory array and a pass transistor for a write operation is disposed on at least two memory arrays in common. Since a write operation of a variable resistance memory device requires a long time compared with a readout operation, a write operation is not affected even when an operation delay of a pass transistor for a write operation connected in common becomes long.

Figure 7:
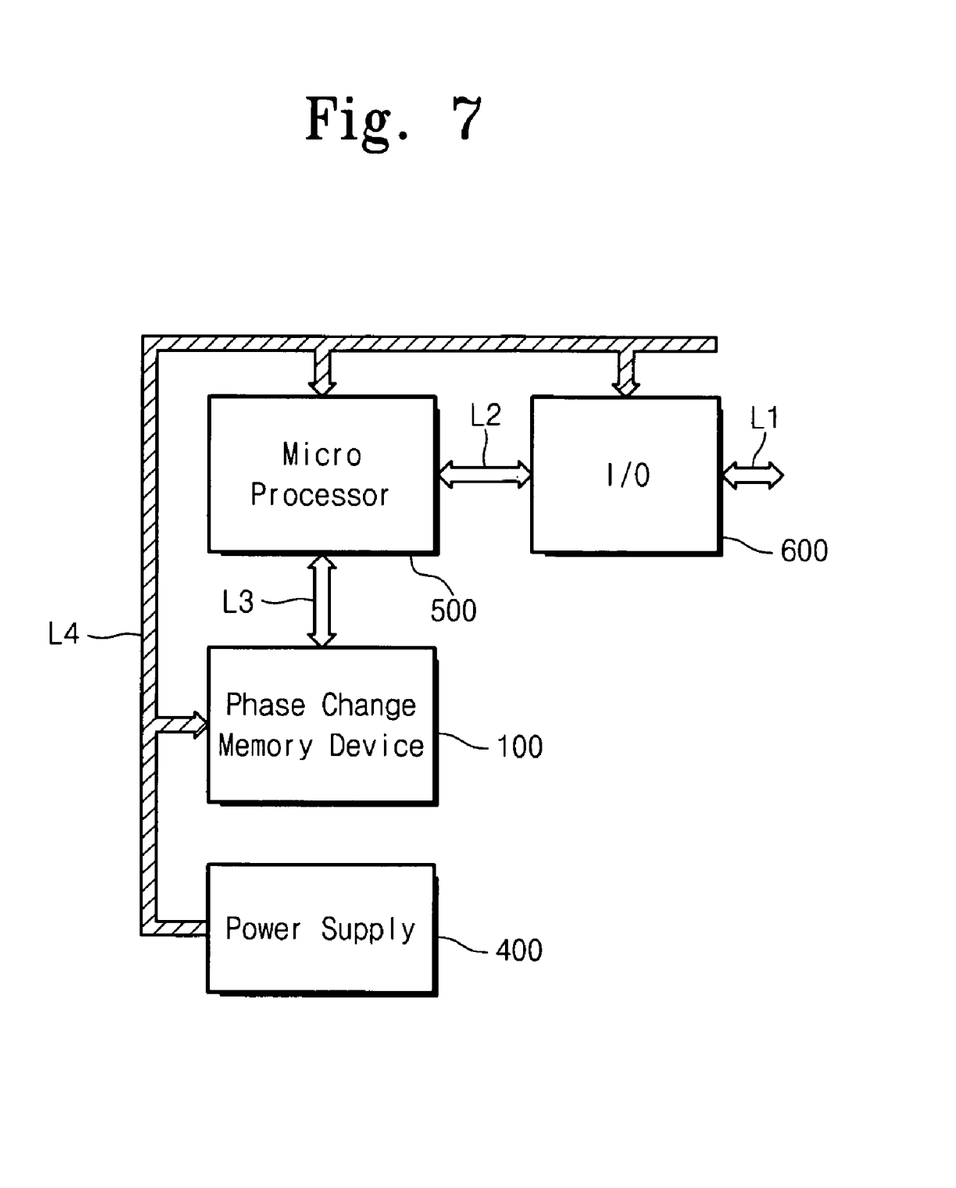
FIG. 7 is a block diagram of a portable electronic system of a variable resistance memory device according to example embodiments.

FIG. 7 is a block diagram of a portable electronic system showing a variable resistance memory device according to example embodiments. A phase change memory device is exemplified in a variable resistance memory device according to example embodiments.

In FIG. 7, a variable resistance memory device 100 connected to a micro processor 500 through a bus line (L3) functions as a main memory of a portable electronic system. A battery 400 provides a power supply to the micro processor 500, an input/output device 600 and the variable resistance memory device 100 through a power supply line (L4).

When received data is provided to the input/output device 600 through a line (L1), the micro processor 500 receives the data through a line (L2). After processing the data, the micro processor 500 transmits the data to the variable resistance memory device 100 through the bus line (L3). The variable resistance memory device 100 stores the data inputted through the bus line (L3) in a memory cell. Also, data stored in a memory cell is readout by the microprocessor 500 to be outputted externally through the input/output device 600.

Even when a power supply of the battery 400 is not provided to the power supply line (L4), data stored in a memory cell of the variable resistance memory device 100 is not lost because of a characteristic of a phase change material. This is because the variable resistance memory device 100 is a nonvolatile memory unlike a DRAM. Also, the variable resistance memory device 100 has advantages of a high operation speed and low power consumption compared with other memories.

In the drawings and specification, there have been disclosed example embodiments and, although specific terms are employed, they are used in a generic and descriptive sense only and not for purposes of limitation, the scope of example embodiments being set forth in the following claims.

What is claimed is:

1. A variable resistance memory device comprising:
    a memory cell array including a plurality of memory blocks;
    a bit line selection circuit to which a bit line of each of the plurality of memory blocks is connected;
    a readout Y-pass driver controlling a connection of the bit line selection circuit when a readout operation is performed; and
    a write Y-pass driver controlling a connection of the bit line selection circuit when a write operation is performed, wherein the write Y-pass driver selects at least two bit lines among the plurality of memory blocks in common.

2. The variable resistance memory device of claim 1, wherein the readout Y-pass driver is connected to each of the plurality of memory blocks.

3. The variable resistance memory device of claim 1, wherein the bit line selection circuit is connected to a bit line of the memory block in response to the readout Y-pass driver when a readout operation is performed and is connected to a bit line of the memory array in response to the write Y-pass driver when a write operation is performed.

4. The variable resistance memory device of claim 1, wherein the memory block comprises a plurality of memory cells and wherein the memory cell comprises a memory element having a phase change material.

5. The variable resistance memory device of claim 1, wherein the memory element stores a plurality of bits.

6. A memory system comprising:
    a central processing unit;
    a variable resistance memory device operated by a control of the central processing unit; and
    an interface device connecting the central processing unit and the variable resistance memory device to each other,
    wherein the variable resistance memory device comprises:
    a memory cell array including a plurality of memory blocks;
    a bit line selection circuit to which a bit line of each of the plurality of memory blocks is connected;
    a readout Y-pass driver controlling a connection of the bit line selection circuit when a readout operation is performed; and
    a write Y-pass driver controlling a connection of the bit line selection circuit when a write operation is performed, wherein the write Y-pass driver selects at least two bit lines among the plurality of memory blocks in common.

7. The memory system of claim 6, wherein the variable resistance memory device has a time of performing a write operation longer than a time of performing a readout operation.

8. The memory system of claim 7, wherein the variable resistance memory device performs a read while write operation.

9. A nonvolatile memory device comprising:
    a plurality of memory cell arrays, each of the plurality of memory cell arrays including a plurality of nonvolatile memory cells arranged in word lines and bit lines, each of the plurality of memory cells having a variable resistance level depending on data stored therein;
    at least one write global bit line to supply write data to one of the plurality of memory cell arrays, the at least one write global bit line selectively coupled with the bit lines;
    at least one read global bit line to readout read data from one of the plurality of memory cell arrays, the at least one read global bit line selectively coupled with the bit lines;
    a plurality of readout Y-pass drivers corresponding to the plurality of memory cell arrays respectively, each of the plurality of readout Y-pass drivers configured to connect one of the plurality of bit lines to a read global bit line when a readout operation is performed; and
    a plurality of write Y-pass drivers corresponding to at least two of the plurality of memory cell arrays respectively, each of the plurality of write Y-pass drivers configured to connect a local bit line to a write global bit line when a write operation is performed.

* * * * *